(12) United States Patent
Katrak

(10) Patent No.: US 8,204,712 B2
(45) Date of Patent: Jun. 19, 2012

(54) TERNARY SENSOR INPUTS

(75) Inventor: Kerfegar Khurshed Katrak, Kalamazoo, MI (US)

(73) Assignee: Eaton Corporation, Cleveland, OH (US)

( * ) Notice: Subject to any disclaimer, the term of this patent is extended or adjusted under 35 U.S.C. 154(b) by 895 days.

(21) Appl. No.: 12/247,067

(22) Filed: Oct. 7, 2008

(65) Prior Publication Data

US 2010/0085082 A1   Apr. 8, 2010

(51) Int. Cl.
*H03K 5/19* (2006.01)
*G06F 11/00* (2006.01)

(52) U.S. Cl. ............ 702/150; 702/58; 702/185; 476/12

(58) Field of Classification Search ............... 702/150, 702/58, 59, 113, 114, 185
See application file for complete search history.

(56) References Cited

U.S. PATENT DOCUMENTS

| | | | |
|---|---|---|---|
| 5,021,764 A * | 6/1991 | Mabee | 340/439 |
| 5,325,083 A | 6/1994 | Nassar et al. | |
| 5,370,015 A | 12/1994 | Moscatelli et al. | |
| 5,371,487 A | 12/1994 | Hoffman et al. | |
| 5,406,860 A | 4/1995 | Easton et al. | |
| 5,519,393 A | 5/1996 | Brandestini et al. | |
| 5,561,416 A | 10/1996 | Marshall et al. | |
| 5,601,513 A | 2/1997 | Arai et al. | |
| 5,714,852 A | 2/1998 | Enderich | |
| 5,736,701 A | 4/1998 | O'Brien et al. | |
| 5,754,963 A | 5/1998 | Nunneley et al. | |
| 5,847,344 A | 12/1998 | Denyer et al. | |
| 6,018,294 A | 1/2000 | Vogel et al. | |
| 6,069,988 A | 5/2000 | Kokura et al. | |
| 6,072,390 A | 6/2000 | Dourra et al. | |
| 6,223,113 B1 | 4/2001 | McCunn et al. | |
| 6,253,136 B1 | 6/2001 | Stratton et al. | |
| 6,324,040 B1 | 11/2001 | Saladin et al. | |
| 6,376,929 B1 * | 4/2002 | Nakajima | 307/10.1 |
| 6,405,611 B1 | 6/2002 | DeJonge et al. | |
| 6,411,879 B2 | 6/2002 | Kupper et al. | |
| 6,492,900 B2 | 12/2002 | Rankin | |
| 6,546,780 B1 | 4/2003 | Palfenier et al. | |
| 6,866,611 B2 | 3/2005 | Tsuzuki et al. | |
| 6,904,823 B2 | 6/2005 | Levin et al. | |
| 7,042,363 B2 | 5/2006 | Katrak et al. | |
| 7,142,132 B2 | 11/2006 | Katrak et al. | |
| 7,242,329 B2 | 7/2007 | Katrak | |
| 7,280,333 B2 | 10/2007 | Horsky et al. | |
| 7,383,120 B2 | 6/2008 | Stockbridge et al. | |
| 7,549,108 B2 | 6/2009 | Katrak et al. | |
| 7,568,402 B2 * | 8/2009 | Robinette et al. | 74/335 |
| 2002/0087239 A1 * | 7/2002 | Kwon | 701/34 |
| 2006/0082386 A1 | 4/2006 | Katrak et al. | |
| 2006/0100758 A1 | 5/2006 | Katrak et al. | |
| 2006/0149496 A1 | 7/2006 | Takeuchi | |
| 2006/0179962 A1 * | 8/2006 | Katrak et al. | 74/335 |
| 2006/0190142 A1 | 8/2006 | Katrak et al. | |
| 2007/0101236 A1 | 5/2007 | Bauerle et al. | |
| 2008/0065294 A1 * | 3/2008 | Katrak et al. | 701/43 |

* cited by examiner

*Primary Examiner* — Hal Wachsman
(74) *Attorney, Agent, or Firm* — Rader, Fishman & Grauer PLLC

(57) ABSTRACT

One of a first signal, a second signal, and a third signal is received respectively from each of three inputs. A pattern formed by the first signal, the second signal, and the third signal is compared to a set of predetermined patterns. Based on the comparing, it is determined whether an error exists. If an error condition exists, a specific one of the inputs is identified as a cause of the error.

24 Claims, 9 Drawing Sheets

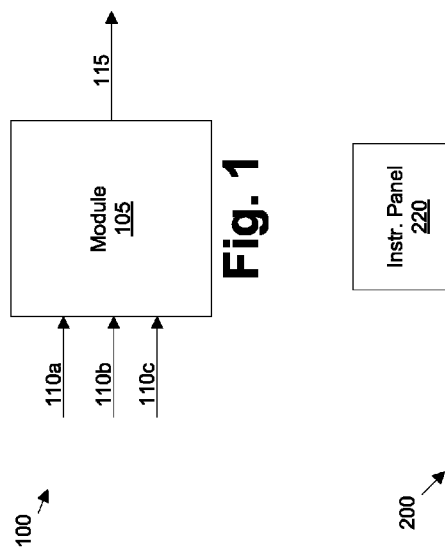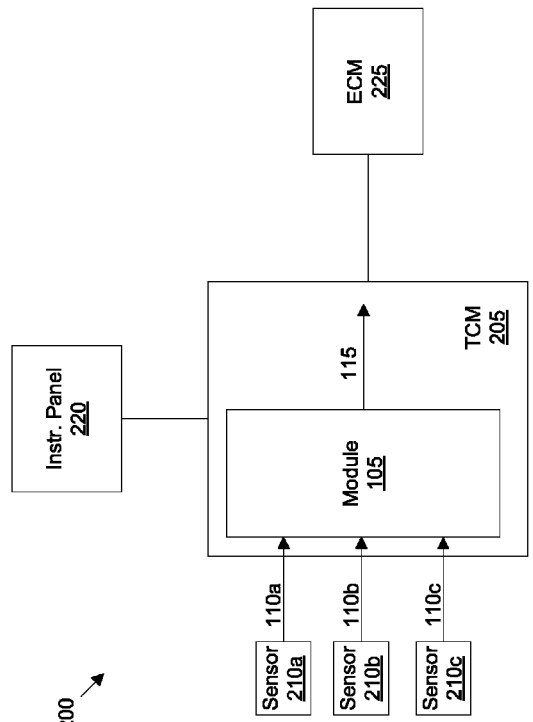

|  | Detent |  | Detent |  | Detent |  | Detent |  | Detent |  | Detent |  |
|---|---|---|---|---|---|---|---|---|---|---|---|---|
| Present Position | P | P-R | R | R-N | N | N-D | D | D-H | H | H-L | L |
| Input 110a | X | X | X | X | X | X | X | X | X | X | X |
| Input 110b | B | B | B | B | B | X | X | X | A | A | A |
| Input 110c | A | X | B | X | X | X | B | X | A | X | B |

505

|  | Detent |  | Detent |  | Detent |  | Detent |  | Detent |  | Detent |  |
|---|---|---|---|---|---|---|---|---|---|---|---|---|
| Present Position | P | P-R | R | R-N | N | N-D | D | D-H | H | H-L | L |
| Input 110a | A | A | X | X | B | B | B | B | B | X | A |
| Input 110b | X | X | X | X | X | X | X | X | X | X | X |
| Input 110c | A | X | B | X | X | X | B | X | A | X | B |

510

|  | Detent |  | Detent |  | Detent |  | Detent |  | Detent |  | Detent |  |
|---|---|---|---|---|---|---|---|---|---|---|---|---|
| Present Position | P | P-R | R | R-N | N | N-D | D | D-H | H | H-L | L |
| Input 110a | A | A | X | X | B | B | B | B | B | X | A |
| Input 110b | B | B | B | B | B | X | X | X | A | A | A |
| Input 110c | X | X | X | X | X | X | X | X | X | X | X |

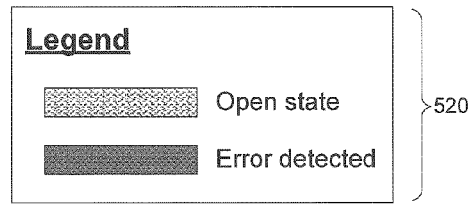

Fig. 5B

| | Detent | | Detent | | Detent | | Detent | | Detent | | Detent | |
|---|---|---|---|---|---|---|---|---|---|---|---|---|
| Present Position | P | P-R | R | R-N | N | N-D | D | D-H | H | H-L | L | |
| Input 110a | A | A | A | A | A | A | A | A | A | A | A | ⎫ 605 |
| Input 110b | B | B | B | B | B | X | X | X | A | A | A | |
| Input 110c | A | X | B | X | X | B | X | A | X | B | | ⎭ |

| | Detent | | Detent | | Detent | | Detent | | Detent | | Detent | |
|---|---|---|---|---|---|---|---|---|---|---|---|---|
| Present Position | P | P-R | R | R-N | N | N-D | D | D-H | H | H-L | L | |
| Input 110a | A | A | X | X | B | B | B | B | B | X | A | ⎫ 610 |
| Input 110b | A | A | A | A | A | A | A | A | A | A | A | |
| Input 110c | A | X | B | X | X | X | B | X | A | X | B | ⎭ |

| | Detent | | Detent | | Detent | | Detent | | Detent | | Detent | |
|---|---|---|---|---|---|---|---|---|---|---|---|---|
| Present Position | P | P-R | R | R-N | N | N-D | D | D-H | H | H-L | L | |
| Input 110a | A | A | X | X | B | B | B | B | B | X | A | ⎫ 615 |
| Input 110b | B | B | B | B | B | X | X | X | A | A | A | |
| Input 110c | A | A | A | A | A | A | A | A | A | A | A | ⎭ |

600 brackets all three tables above.

Fig. 6A

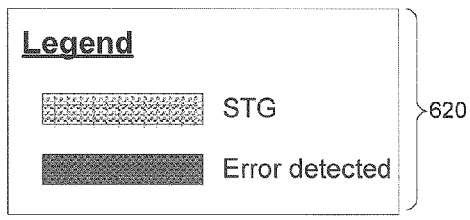

Fig. 6C

| Present Position | Detent | | Detent | | Detent | | Detent | | Detent | | Detent |
|---|---|---|---|---|---|---|---|---|---|---|---|
| | P | P-R | R | R-N | N | N-D | D | D-H | H | H-L | L |
| Input 110a | A | A | A | A | A | A | A | A | A | A | A |
| Input 110b | B | B | B | B | B | X | X | X | A | A | A |
| Input 110c | A | X | B | X | X | X | B | X | A | X | B |

605'

| Present Position | Detent | | Detent | | Detent | | Detent | | Detent | | Detent |
|---|---|---|---|---|---|---|---|---|---|---|---|
| | P | P-R | R | R-N | N | N-D | D | D-H | H | H-L | L |
| Input 110a | A | A | X | X | B | B | B | B | B | X | A |
| Input 110b | A | A | A | A | A | A | A | A | A | A | A |
| Input 110c | A | X | B | X | X | X | B | X | A | X | B |

610'

| Present Position | Detent | | Detent | | Detent | | Detent | | Detent | | Detent |
|---|---|---|---|---|---|---|---|---|---|---|---|
| | P | P-R | R | R-N | N | N-D | D | D-H | H | H-L | L |
| Input 110a | A | A | X | X | B | B | B | B | B | X | A |
| Input 110b | B | B | B | B | B | X | X | X | A | A | A |
| Input 110c | A | A | A | A | A | A | A | A | A | A | A |

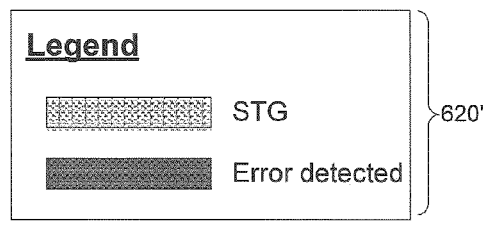

Fig. 6D

| Present Position | Detent | P-R | Detent | R-N | Detent | N-D | Detent | D-H | Detent | H-L | Detent |
|---|---|---|---|---|---|---|---|---|---|---|---|
| | P | R | R | N | N | D | D | H | H | L | L |
| Input 110a | B | B | B | B | B | B | B | B | B | B | B |
| Input 110b | B | B | B | B | B | X | X | X | A | A | A |
| Input 110c | A | X | B | X | X | X | B | X | A | X | B |

705

| Present Position | Detent | P-R | Detent | R-N | Detent | N-D | Detent | D-H | Detent | H-L | Detent |
|---|---|---|---|---|---|---|---|---|---|---|---|
| | P | R | R | N | N | D | D | H | H | L | L |
| Input 110a | A | A | X | X | B | B | B | B | B | X | A |
| Input 110b | B | B | B | B | B | B | B | B | B | B | B |
| Input 110c | A | X | B | X | X | X | B | X | A | X | B |

710

| Present Position | Detent | P-R | Detent | R-N | Detent | N-D | Detent | D-H | Detent | H-L | Detent |
|---|---|---|---|---|---|---|---|---|---|---|---|
| | P | R | R | N | N | D | D | H | H | L | L |
| Input 110a | A | A | X | X | B | B | B | B | B | X | A |
| Input 110b | B | B | B | B | B | X | X | X | A | A | A |
| Input 110c | B | B | B | B | B | B | B | B | B | B | B |

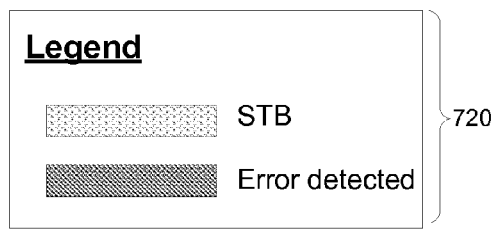

Fig. 7C

| | | Detent | | Detent | | Detent | | Detent | | Detent | | Detent | |
|---|---|---|---|---|---|---|---|---|---|---|---|---|
| Present Position | P | P-R | R | R-N | N | N-D | D | D-H | H | H-L | L | |
| Input 110a | B' | B' | B' | B' | B' | B' | B' | B' | B' | B' | | 705' |
| Input 110b | B | B | B | B | B | X | X | X | A | A | A | |
| Input 110c | A | X | B | X | X | X | B | X | A | X | B | |

| | | Detent | | Detent | | Detent | | Detent | | Detent | | Detent | |
|---|---|---|---|---|---|---|---|---|---|---|---|---|
| Present Position | P | P-R | R | R-N | N | N-D | D | D-H | H | H-L | L | |
| Input 110a | A | A | X | X | B | B | B | B | B | X | A | |
| Input 110b | B' | B' | B' | B' | B' | B' | B' | B' | B' | B' | B' | 710' |
| Input 110c | A | X | B | X | X | X | B | X | A | X | B | |

| | | Detent | | Detent | | Detent | | Detent | | Detent | | Detent | |
|---|---|---|---|---|---|---|---|---|---|---|---|---|
| Present Position | P | P-R | R | R-N | N | N-D | D | D-H | H | H-L | L | |
| Input 110a | A | A | X | X | B | B | B | B | B | X | A | |
| Input 110b | B | B | B | B | B | X | X | X | A | A | A | |
| Input 110c | B' | B' | B' | B' | B' | B' | B' | B' | B' | B' | B' | 715' |

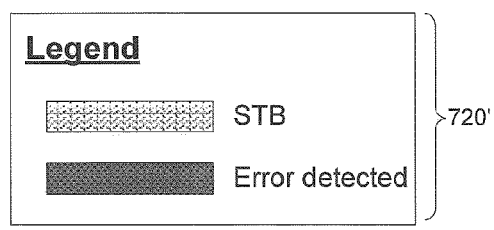

Fig. 7D

TERNARY SENSOR INPUTS

BACKGROUND

It is often useful to detect the position of a knob, lever, or other mechanism. For example, the vast majority of vehicles today employ automatic transmissions. A driver may use a lever or the like to direct the automatic transmission to change gears. Sensors may be used to detect a position of the lever, and hence detect the driver's intent with respect to the status of the vehicle's transmission, i.e., how the driver intends the vehicle engine to be presently geared.

For example, a driver of a passenger car may generally select park, reverse, neutral, drive, and low as positions of a selection mechanism for an automatic transmission. A driver of a medium duty or heavy-duty truck may select park, reverse, neutral, drive, hold, and low as positions of a selection mechanism for an automatic transmission. In either case, the selection mechanism is generally biased so that the knob, lever, etc., used in the selection mechanism naturally settles in a detent position, e.g., park, reverse, etc., when moved. However, when a driver is in the act of moving the knob, lever, etc., the selection mechanism may be in a transition position between two detent positions.

By analyzing sensor inputs to determine a position of a selection mechanism, a processor can provide appropriate instructions for a device to act according to the position of the selection mechanism. For example, when a driver moves an automatic transmission selector from "park" to "reverse," a transmission control module (TCM) may detect a new position of the automatic transmission selector, e.g., reverse, and may accordingly instruct an automatic transmission to transition a vehicle from a "park" state to a "reverse" state.

Unfortunately, present mechanisms for determining a position of a selection mechanism are generally lack robustness. For example, although it is critical to safe operation of a vehicle to be able to detect a driver's intent with respect to the state of an automatic transmission, present arrangements of sensors do not necessarily provide assurance that the driver's intent will be properly detected. Further, present arrangements of sensors often require numerous sensors to be deployed. A robust sensor system deploying fewer sensors would be desirable.

BRIEF DESCRIPTION OF THE DRAWINGS

FIG. 1 illustrates an exemplary sensor input system.

FIG. 2 illustrates an exemplary automatic transmission selector position detection system.

FIG. 5A includes exemplary tables illustrating what are referred to as open conditions in each respective input. FIG. 5B illustrates an exemplary legend for the tables of FIG. 5A.

FIGS. 6A and 6B include exemplary tables illustrating short to ground (STG) conditions in respective inputs. FIGS. 6C and 6D illustrate exemplary legends for the tables of FIGS. 6A and 6B, respectively.

FIGS. 7A and 7B include exemplary tables illustrating short to battery (STB) conditions in respective inputs. FIGS. 7C and 7D illustrate exemplary legends for the tables of FIGS. 7A and 7B, respectively.

DETAILED DESCRIPTION OF PREFERRED EMBODIMENTS

System Overviews

Figure 3:
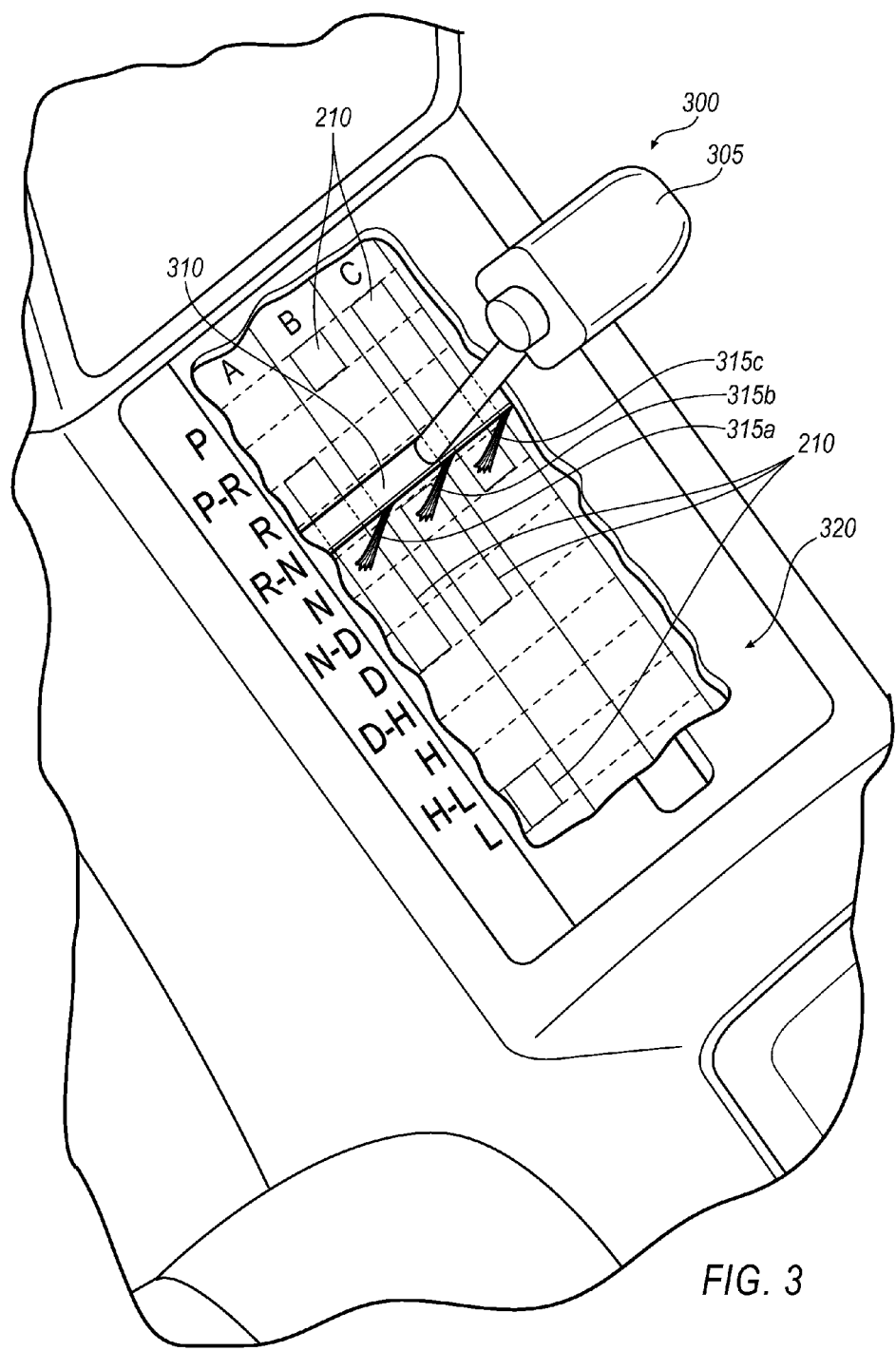
FIG. 3 illustrates an exemplary automatic transmission selector mechanism.

FIG. 1 illustrates an exemplary sensor input system 100. A sensor detection module 105 receives inputs 110a-c, and provides an output instruction 115.

Inputs 110 are ternary, meaning that an input 110 may include one of three states. Various mechanisms could be used for providing ternary inputs, such as pulse width modulation (PWM), variable frequency, voltage dividers, etc., using a standard excitation voltage of, for example, 5 volts. The three states could be represented in a variety of ways. The convention used herein for representing three possible ternary states is for a value representing an input 110 to be displayed as either "A", "X", or "B".

In the presently illustrated implementation, A and B are generally referred to as asserted states, whereas X is usually referred to as an open or default state. In the presently illustrated implementation, A is generally referred to as a low asserted state, while B is generally referred to as a high asserted state. The terms "high" and "low" are arbitrary with respect to at least some implementations, and do not necessarily denote any relation of the states A and B to one another, although such relation could exist. For example, A and B could represent respective low and high voltage levels provided by input 110, whereas X could represent a circuit open position, or no voltage provided by input 110. Alternatively, A and B could represent low and high PWM duty cycles, respectively, provided by input 110, whereas X could represent no duty cycle. For example, in one present implementation, X represents no duty cycle, A represents a 20-30% duty cycle, and B represents a duty cycle of 70-80% or higher. In another exemplary approach, X represents a 50% duty cycle, A represents a duty cycle of 30% or lower, and B represents a duty cycle of 70% or higher. In general, inputs 110 may be referred to as providing signals, where a signal provided by an input 110 is one of an indication of an A state, a B state, or an X state. Note that, even when the input 110 is indicating the X state, which, as an open state, could be said to include no signal, the input 110 is nonetheless said to be providing an X state signal. Thus, the "X" state may be a default state (e.g., a PWM signal with a 50% duty cycle), or a non-asserted open state (e.g., a PWM signal with no duty cycle). Further, X may be a default state in other implementations, such as with a voltage divider circuit.

The duty cycles described above for states A, B, and X are merely exemplary. Other duty cycles may be used to represent the various states. For example, the duty cycles for A and B as described above may be complementary to each other, meaning the sum of their respective duty cycles is approximately 100%. Alternatively, A and B may be non-complimentary, meaning the sum of their respective duty cycles does not equal 100%. For example, in one implementation, non-complementary duty cycles are employed, with A representing a 19-21% duty cycle, and B representing a 69-71% duty cycle. In another implementation of non-complementary duty cycles, A represents a 34-36% duty cycle and B represents an 84-86% duty cycle.

Advantageously, making duty cycles representing A and B non-complementary may reduce false readings of the states due to timing or other errors. For example, a sensor 210 may be configured to measure the duty cycle by detecting rising edges as the beginning of the standard excitation voltage and falling edges as the beginning of a ground or zero voltage. However, the sensor 210 may invert the duty cycle by detecting the falling edges as the beginning of the standard excitation voltage, and the rising edges as the beginning of the ground or zero voltage. If the duty cycles of A and B complement one another, such a timing error will result in the duty cycles of A and B being confused with one another. Accordingly, making the duty cycles of A and B non-complementary allows for easier detection of faulty readings at the sensor inputs 110a-c. It is to be appreciated that the states A and B may be similarly represented by, and the foregoing discussion may similarly apply to, variable frequency signals.

Module 105 generally includes a processor and a memory, the memory storing instructions executable by the processor for, among other things, analyzing sensor inputs 110a-c and determining, based on the sensor inputs 110, an appropriate output instruction 115. For example, output instruction 115 may include an instruction to control a vehicle transmission based on a position of an automatic transmission selector position detected according to sensor inputs 110. That is, if a vehicle driver has placed an automatic transmission selector in a "reverse" position, output instruction 115 may include an instruction for a vehicle transmission to be placed in a "reverse" state.

The memory included in module 105 may include a variety of computer-readable media such as are discussed further below. Further, in some cases, module 105 may simply include a set of instructions stored in a memory and executable by a processor, where the processor and/or the memory are used for operations other than operations attributable to module 105. For example, such an arrangement is described below with respect to FIG. 2.

Module 105 is often included in a vehicle. Further, as described in more detail below, sensor inputs 110 may result from detecting a position of an automatic transmission selector mechanism in the vehicle. However, sensor system 100 could be deployed in other contexts, wherever a position of a knob, a lever, or other selector mechanism may be detected.

FIG. 2 illustrates an exemplary automatic transmission position selector detection system 200. In the detection system 200, sensor detection module 105 is included in a transmission control module (TCM) 205. Sensors 210a-c provide sensor inputs 110a-c, e.g., sensors 210a-c may output an electrical voltage, a PWM duty cycle, variable frequencies, etc., whereby inputs 110 may provide a ternary signal on a continuous or near continuous basis depending on output from an associated sensor 210. For example, sensors 210 may be electrical contacts or the like that, when a selector mechanism such as a shift lever, knob, etc., is positioned over the contact, e.g., as discussed below with respect to FIG. 3, provided a voltage at either a low asserted state A or a high asserted state B.

TCM 205 generally includes a processor and a memory. Accordingly, sensor detection module 105 may include a set of instructions stored in the memory of the TCM 205, and executable by the processor of the TCM 205. Accordingly, TCM 205 may provide output instruction 115 to other modules in a vehicle, such as instrument panel 220 and engine control module (ECM) 225. Instruction 115 may be provided over a vehicle communications bus or other linkage according to the known controller area network (CAN) protocol, or some other suitable communications protocol or mechanism.

Selector Mechanism

FIG. 3 illustrates an exemplary automatic transmission selector mechanism 300. Shift lever 305 is attached to brush plate 310 in a substantially perpendicular manner. Brushes 315a-c extend from brush plate 310, such that the brushes 315 may variously make contact with sensors 210a-c disposed in sensor field 320. Brushes 315 are generally formed of a conductive metal or some other electrically conductive material, such that when a brush 315 makes contact with a sensor 210, an electrical circuit may be formed. Accordingly, by applying a predetermined voltage to brushes 315, when a brush 315 makes contact with a sensor 210, the sensor 210 may output a voltage, e.g., a voltage at a low asserted state A or a high asserted state B.

In one exemplary approach, each sensor 210 is electrically connected to a voltage source. For example, a sensor 210 may be connected to a voltage source outputting a negative voltage with a magnitude of the standard excitation voltage (e.g., −5 volts) in order to generate state A. Further, a sensor 210 may be connected to a voltage source outputting the standard excitation voltage (e.g., +5 volts) in order to generate state B. When a sensor input 110 receives the negative standard excitation voltage, state A is detected. Similarly, when a sensor inputs 110 receives a signal substantially equivalent to the standard excitation voltage, state B is detected.

In one implementation, a sensor 210 is described as being in an open state when a brush 315 is not in contact with the sensor (e.g., when a signal of zero volts is received). However, as previously discussed, instead of a physically open state, X may be a default state represented by an asserted state (e.g., a signal having a voltage). Alternatively, states A, B, and X may be represented by PWM signals, as described above. In this case, each of the sensors 210 is electrically connected to a signal generator that generates the appropriate PWM signal. For example, the sensors 210 representing state A may receive a signal having a duty cycle in a range around 35% from the signal generator, while the sensors 210 representing state B may receive a signal having a duty cycle in a range around 85% from the signal generator. In a PWM implementation, X may be a default state where the sensors 210 representing state X may receive a signal having a duty cycle of in a range surrounding 50% from the signal generator.

As illustrated in FIG. 3, sensors 210 may be disposed contiguously to detect various positions of shift lever 305, or may be contiguously absent. Having sensors 210 be contiguous, or contiguously absent, between states may further facilitate the detection of errors, because contiguous or contiguously absent sensors 210 will be expected to provide a continuous input 110, e.g., a continuous A, B, or X. If, for example, input 110a provides a 1 during a transition from a first state to a second state where sensor 210a is disposed to provide input 110a for both the first state and the second state, then the detection of a 0 should give rise to an error condition.

Systems 100 and 200 may be used to detect a position of physical members other than shift lever 305. For example, knobs, switches, and the like may have different positions that may be detected according to the systems and methods described herein. Accordingly, descriptions herein of detecting a position of shift lever 305 are intended to be applicable to other physical members as well as shift lever 305.

Position Determination Table

Figure 4:
FIG. 4 illustrates an exemplary table for analyzing sensor inputs and determining a position of a selector mechanism such as a shift lever.

FIG. 4 illustrates an exemplary table 400 for analyzing sensor inputs 110 and determining a position of a selector mechanism such as shift lever 305. Table 400 illustrates values for sensor inputs 110a-c associated with each of the possible present positions of shift lever 305. That is, in the present illustration, shift lever 305 has possible present detent positions P, R, N, D, H, and L. Accordingly, shift lever 305 further has possible transition positions P-R, R-N, N-D, D-H, and H-L. Thus, for example, when sensor detection module 105 detects a predetermined pattern of A, B, A from inputs 110a, 110b, and 110c, respectively, module 105 determines that shift lever 305 is expected to be in a park position. Similarly, to provide another example, when sensor detection module 105 detects a pattern of B, X, X from inputs 110a, 11b, and 110c, respectively, module 105 determines that shift lever 305 is expected to be in a transition position between the neutral position and the drive position. As can be seen, inputs 110 form a pattern that can be evaluated, and that can be compared to stored patterns, e.g., patterns stored in a memory included in, or accessible to, module 105.

Sensor detection module 105 could be implemented to detect input patterns other than those illustrated in table 400. However, certain principles in the creation of table 400 enhance the robustness and reliability of sensor detection module 105. For example, it is more important to be able to properly detect detent positions of shift lever are 305 than it is to be able to detect transition positions. Therefore, patterns of inputs 110a, 110b, and 110c associated with adjacent detent positions are separated by a Hamming distance of at least two. Given two strings of equal length, a Hamming distance is the number of characters in a first string that are different from characters in a second string at like positions. For example, the strings, or patterns, ABA and XBB have a Hamming distance of two, because characters in the first and third positions of the strings are different from one another.

Detent positions separated only by a transition position are considered to be adjacent to one another. Separating adjacent detent positions by a Hamming distance of at least two beneficially provides robustness to system 200. When shift lever 305 moves from a first detent position to a second detent position, a vehicle driver's intent is to change the state of the vehicle's transmission, e.g., to transition from reverse to neutral, from neutral to drive, etc. Because a transmission of the vehicle's transmission could make vehicle operation hazardous and even life-threatening if performed inappropriately, it is beneficial to ensure that a change to the state of a vehicle's transmission is really intended. Thus, for module 105 to detect a change from a first detent position to a second detent position, module 105 must attack that two of the three inputs 110a, 110b, and 110c have changed, i.e., that the condition of a Hamming distance of two between adjacent detent positions is satisfied.

A further principle is that asserted states provide more robustness than non-asserted, or open states. Thus, with reference to the presently illustrated implementation, states A and B provide more robustness than state X. Therefore, as seen in FIG. 4, every detent position is associated with at least two asserted states. Moreover, to further augment robustness of system 200, in detent positions associated with the X state being provided by one of the inputs 110, the asserted state associated with the other two inputs 110 is the high asserted state, e.g., referred to as B in the presently illustrated implementation. Further, every non-detent position includes at least one asserted state.

A further principle in the generation of table 400 is that detection of reverse, neutral, and drive states is of utmost importance for safe and effective operation of a vehicle. Therefore, each of reverse, neutral, and drive requires two high asserted states, which are generally considered to be more reliable when detected by module 105.

Error Condition Tables

FIGS. 5A, 6A, 6B, 7A, and 7B illustrate various error conditions that may arise in the presently illustrated implementation. FIG. 5A includes an exemplary set 500 of tables 505, 510, and 515, illustrating what are referred to as open conditions, e.g., an open circuit condition, in each of inputs 110a, 110b, and 110c, respectively. FIG. 5B illustrates an exemplary legend 520 for the set 500 of tables 505, 510, and 515 of FIG. 5A. FIGS. 6A and 6B include exemplary sets 600 and 600' of tables 605, 610, and 615, and 605', 610', and 615', respectively, illustrating short to ground (STG) conditions in each of inputs 110a, 110b, and 110c, respectively. FIGS. 6C and 6D illustrate exemplary legends 620 and 620' for the tables of FIGS. 6A and 6B, respectively. FIGS. 7A and 7B include exemplary set 700 and 700' of tables 705, 710, and 715, and 705', 710', and 715', respectively, illustrating short to battery (STB) conditions in each of inputs 110a, 110b, and 110c. FIGS. 7C and 7D illustrate exemplary legends 720 and 720' for the tables of FIGS. 7A and 7B, respectively.

Starting with FIG. 5A, table 505 illustrates an open conditions existing with respect to input 110a. Tables 510 and 515 illustrate an open condition existing with respect to inputs 110b and 110c respectively. In some cases, an open condition means that a wire or some other element that is part of a circuit including an input 110 has become improperly disconnected from the circuit, i.e., the input 110 is "open." However, as discussed herein, an open condition is said to exist with respect to an input 110 any time the input 110 consistently provides the non-asserted X state.

In each of tables 505, 510, and 515, state X is shaded for positions in which module 105 may detect an error condition, i.e., positions where the presence of the X state means that an error condition must exist. For example, the "X" that appears with respect to input 110a in the "P" column is shaded in table 505. This shading means that any time module 105 detects the X state with respect to input 110a in the "P" column, an error exists. However, as also seen in table 505, the X state that appears for input 110a in the "P-R," "R," "R-N," and "N" columns is not shaded because, as can be seen with reference to table 400 in FIG. 4, the X state is expected to appear for input 110a in these columns.

Turning to FIG. 6A, table 605 illustrates a short to ground (STG) condition existing with respect to input 110a. Tables 610 and 615 illustrate a STG condition existing with respect to inputs 110b and 110c respectively. In some cases, a STG condition means that a wire or other element that is part of a circuit including an input 110 has become improperly grounded. However, as discussed herein, a STG condition is said to exist with respect to an input 110 any time the input 110 consistently provides the low-asserted A state.

In each of tables 605, 610, and 615, state A is shaded for positions in which module 105 may detect an error condition, i.e., positions where the presence of the A state means that an error condition must exist. For example, the "A" that appears with respect to input 110a in the "R" column is shaded in table 605. This shading means that any time module 105 detects the A state with respect to input 110a in the "R" column, an error exists. However, in table 605, the A state that appears for input 110a in the "P" and "P-R" columns is not shaded because, as can be seen with reference to table 400 in FIG. 4, the A state is expected to appear for input 110a for the "P" and "P-R" columns.

FIG. 6A represents an implementation in which the low-asserted A state is represented by a range of values associated with an input 110. For example, as mentioned above, the low-asserted A state could be represented by a PWM duty cycle in the 0-20% range, a range of frequencies from 0 to 200 Hz, etc. Thus, where PWM is being used, for example, module 105 could detect no PWM duty cycle, i.e., a 0% reading, and in such event would be unable to determine whether the 0% reading was due to a sensor 210 providing the A state, or to an error condition, e.g., a STG condition. This is why FIG. 6A shows a STG error being undetected with respect to certain expected positions of shift lever 305. For example, as noted in the previous paragraph, in table 605, the A state that appears for input 110*a* in the "P" and "P-R" columns is not shaded because, as can be seen with reference to table 400 in FIG. 4, the A state is expected to appear for input 110*a* for the "P" and "P-R" columns.

However, turning now to FIG. 6B, it can be seen with reference to table 605' that detection of a state A' allows module 105 to determine that an error state, specifically a STG condition, exists even where the expected position of shift lever 305 is the "P" position. In fact, in the implementation illustrated in tables 605', 610', and 615', an error state, specifically a STG condition, may be readily detected by module 105 regardless of the expected position of shift lever 305. This is because, in this implementation, unlike the implementation illustrated in FIG. 6A, module 105 is configured to associate the low-asserted A state with a first range of values of an input 110, and to associate a STG condition with a second range of values of an input 110. Continuing to use a PWM implementation as exemplary, module 105 could be configured to associate the low-asserted A state with a PWM duty cycle in the 20-25% range, and to associate a STG condition with any value of an input 110 below a 20% PWM duty cycle. Accordingly, each of tables 605', 610', and 615', illustrate states A' in which module 105 is configured to detect a STG condition.

Turning to FIG. 7A, table 705 illustrates a short to battery (STB) condition existing with respect to input 110*a*. Tables 710 in 715 illustrate a STB condition existing with respect to inputs 110*b* and 110*c* respectively. In some cases, a STB condition means that a wire or other element that is part of a circuit including an input 110 has become improperly connected to a vehicle battery or other power source. However, as discussed herein, a STB condition is said to exist with respect to an input 110 anytime the input 110 consistently provides the high-asserted B state.

In each of tables 705, 710, and 715, state B is shaded for positions in which module 105 may detect an error condition, i.e., positions where the presence of the B state means that an error condition must exist. For example, the "B" that appears with respect to input 110*a* in the "P" column is shaded in table 505. This shading means that any time module 105 detects the B state with respect to input 110*a* in the "P" column, an error exists. However, in table 705, the B state that appears for input 110*a* in the "P-R," "R-N," "N," "N-D," "D," "D-H," and "H" columns is not shaded because, as can be seen with reference to table 400 in FIG. 4, the B state is expected to appear for input 110*a* for these columns.

FIG. 7A is similar to FIG. 6A, in that FIG. 7A represents an implementation in which the high-asserted B state is represented by a range of values associated with an input 110. For example, as mentioned above, the high-asserted B state could be represented by a PWM duty cycle in the 70-100% range, a range of frequencies from 650-700 Hz, etc. Thus, where PWM is being used, for example, module 105 could detect a constant PWM duty cycle, i.e., a 100% reading, and in such event would be unable to determine whether the 100% reading was due to a sensor 210 providing the B state, or to an error condition, e.g., a STB condition. This is why FIG. 7A shows a STB error being undetected with respect to certain expected positions of shift lever 305. For example, as noted in the previous paragraph, in table 705, the B state that appears for input 110*a* in the "P-R," "R-N," "N," "N-D," "D," "D-H," and "H" columns is not shaded because, as can be seen with reference to table 400 in FIG. 4, the B state is expected to appear for input 110*a* for these columns.

However, turning now to FIG. 7B, it can be seen with reference to table 705' that detection of a state A' allows module 105 to determine that an error state, specifically a STG condition, exists even where the expected position of shift lever 305 is, for example, the "P-R" position. In fact, in the implementation illustrated in tables 605', 610', and 615', an error state, specifically a STB condition, may be readily detected by module 105 regardless of the expected position of shift lever 305. This is because, in this implementation, unlike the implementation illustrated in FIG. 7A, module 105 is configured to associate the high-asserted B state with a first range of values of an input 110, and to associate a STB condition with a second range of values of an input 110. Continuing to use a PWM implementation as exemplary, module 105 could be configured to associate the high-asserted B state with a PWM duty cycle in the 65-70% range, and to associate a STB condition with any value of an input 110 above a 70% PWM duty cycle. Accordingly, each of tables 705', 710', and 715', illustrate states B' in which module 105 is configured to detect a STB condition.

Advantageously, if module 105 is configured to distinguish between STB and A states, e.g., between A and A' states, and/or between STG and B states, e.g., between B and B' states, a specific input 110 responsible for an error state may be promptly detected even if shift lever 305 is not moved, or even if inputs 110 do not otherwise change, and the specific error condition may also be identified.

Even if module 105 is not configured to distinguish between STB and A states, on the one hand, and/or STG and B states, on the other hand, a comparison of table 400 illustrated in FIG. 4 with the tables illustrating each of FIGS. 5, 6A, and 7A demonstrates how, not only may error states be detected, but a specific input 110 responsible for the error state may be identified. For example, according to table 400, the park state is indicated when inputs 110*a*, 110*b*, and 110*c*, respectively indicate A, B, A. Therefore, if an initial detected set of inputs 110 includes an open or X state, module 105 may determine that an error condition exists, and also may determine that the particular input 110 indicating the open state is responsible for the error condition.

To take another example, note that when shift lever 305 is in a reverse detent position, inputs 110*a*, 110*b*, and 110*c*, respectively, are expected to indicate X, B, B. Therefore, as illustrated in table 505 in FIG. 5A, if an open error condition arises with respect to input 110*a* while shift lever 305 is in a reverse position module 105 will not immediately detect the error condition. Moreover, an error condition will not necessarily be detected if input 110*a* is improperly in an open condition when shift lever 305 is moved to the P-R transition position, the R-N transition position, or to the neutral detent position. That is, as seen in table 400, input 110*a* is expected to be in the open condition when shift lever 305 is in the reverse position or the R-N position. This is because the R-N position is associated with the pattern X, B, X. Therefore, when shift lever 305 is moved from the reverse position to either of the adjacent transition positions, and when an open state improperly exists with respect to input 110*a*, module 105 will detect the pattern X, B, X. That is, regardless of whether shift lever 305 has been moved from the reverse position to the P-R or the R-N position, or from the R-N position to the neutral position, module 105 will detect that the shift lever is expected to be in the R-N position. Only when shift lever 305 is moved from the reverse position to either the park detent position or the N-D transition position can module 105 determine that an error state exists. Further, module 105 can determine that the error condition exists with respect to input 110*a*.

Such error detection as illustrated with respect to FIGS. 5A, 6A, and 7A is possible because patterns of inputs 110 associated with the park detent position and the N-D transition position each have Hamming distances of two from a pattern associated with the neutral detent position, and a pattern associated with the R-N transition position has a Hamming distance of two from a pattern of inputs 110 associated with the P-R transition position. As noted above, in the presently illustrated implementation, detent positions are always represented by patterns of inputs 110 that have a Hamming distance of two from one another. Further, as can be seen in the present example, transition positions are sometimes represented by patterns of inputs 110 that have a Hamming distance of two. Where movement of shift lever 305 from a first position to a second position is expected to result in a first pattern of inputs 110 having a Hamming distance of two from a second pattern of inputs 110 associated with the second position, an error associated with one of the inputs 110 may generally always be detected when shift lever 305 is moved from the first position to the second position.

In essence, a Hamming distance of two between patterns associated with positions of shift lever 305 allows for isolating an erroneous input. As can be seen in table 400, inputs 110b and 110c by themselves are each expected to provide a unique pattern for each of the six detents positions shown in table 400. This uniqueness of the inputs 110b and 110c is an artifact of having a Hamming distance of two between patterns for detent positions. The presently illustrated implementation takes advantage of this artifact. Specifically, module 105 can determine an expected value for input 110a based on values of inputs 110b and 110c, assuming at least one of the values for inputs 110b and 110c have changed, signaling a new position, e.g., a new detent position. Put another way, module 105 may detect a change from a first detent position to a second detent position according to only two of the three inputs 110. Thus, in this example, when shift lever 305 is moved from the reverse position to either the park position or the N-D transition position, module 105 may determine not only that an error condition exists, but that the error condition is caused by an improper open condition of input 110a. Being able to not only diagnose an error condition, but to be able to pinpoint the particular input 110 responsible for the error condition, as well as the improper state of the input 110, presents a significant advantage and benefit.

Process Flow

Figure 8:
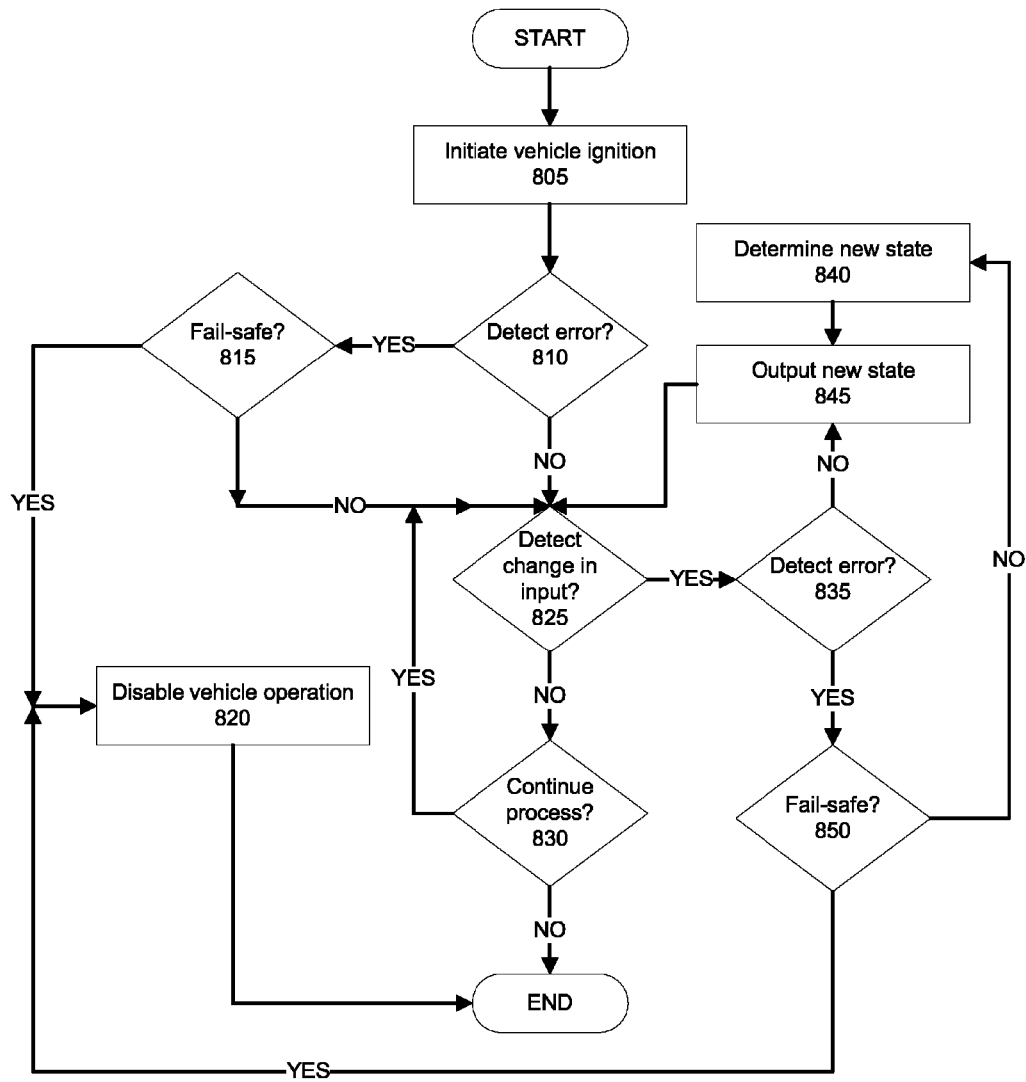
FIG. 8 illustrates an exemplary process for detecting sensor inputs.

FIG. 8 illustrates an exemplary process 800 for detecting sensor 210 inputs 110. Some or all of process 800 could be implemented as computer-executable instructions included in sensor detection module 105.

Process 800 begins in a step 805, when sensor detection module 105 detects that a vehicle ignition has been initiated. Again, it is emphasized that, although the presently illustrated implementation is described with reference to a system 200 in a vehicle, sensor detection system 100 could be deployed in other contexts.

Next, in step 810, module 105 determines whether an error condition has been detected with respect to any of inputs 110. For example, with reference to table 705 shown in FIG. 7, if module 105 detects a pattern that clearly indicates an error condition immediately upon vehicle ignition, e.g., input 110a is providing a B state, module 105 may reach a determination that a short to battery error condition exists. For another example, if each of inputs 110 is the same value, e.g., all inputs 110 provide an X, then module 105 may reach a determination that an unknown error condition exists. If module 105 determines that an error condition exists, then step 815 is executed next. However, if no error is detected, then step 825 is executed following step 810.

In step 815, module 105 determines whether to apply a fail-safe or fail-soft mode. In some implementations, not reflected in FIG. 8, a fail-safe mode is always applied. In a fail-safe mode, any error condition is unacceptable. Thus, in some implementations, any error condition is deemed unacceptable. However, in the presently illustrated implementation, module 105 may identify certain errors as acceptable for operation in fail-soft mode. In fail-soft mode, system 200 may continue to operate, e.g., for a period of time until a vehicle may return to a location where repairs are possible.

Module 105 may be programmed with certain criteria for determining whether to apply a fail-safe for fail-soft mode. In some cases, it may be that, although an error condition is detected with respect to one input 110, operations of system 200 may nonetheless proceed, because positions of shift lever 305 may still be determined. For example, as noted above, in the presently illustrated implementation, detent positions of shift lever 305 may generally be detected with only two working inputs 110 of the three provided inputs 110. Further, detecting non-detent, or transition, positions may be deemed not critical to safe vehicle operation. Therefore, if a detected error is a failure of a single input 110, system 200 may be allowed to proceed, at least for a limited period of time, in a sale-soft mode.

If module 105 determines to apply a fail-safe mode, then step 820 is executed next. Otherwise, step 825 is executed following step 815.

In step 820, module 105 causes system 200 to be disabled. In practice in the presently illustrated implementation, this means causing vehicle operation to be disabled. For example, module 105 could send an output instruction 115 to 18 control module 225 to disable agent operations. Following step 820, process 800 ends.

In step 825, which may follow any of steps 810, 815, or 830, sensor detection module 105 determines whether a change is detected with respect to any input 110. That is, as described above, each sensor 210 will provide as an input 110 one of the following: "A," "B," or "X." When shift lever 305 is moved, respective sensors 210 may provide different outputs, thus causing inputs 110 to change. Further, inputs 110 may change when an error condition arises. For example, with reference to table 715 in FIG. 7, if shift lever 305 is in the drive position, and a vehicle accordingly is in a drive state, and a STB condition then arises with respect to input 110b, a change in inputs 110 will be detected in step 825, specifically, input 110b will change from the X state to the B state. However, such change will be detected because an error condition has arisen, not because a vehicle driver has moved shift lever 305. In any case, if a change in one or more of inputs 110 is detected in step 825, step 835 is executed next. Otherwise, step 830 is executed next.

In step 830, module 105 determines whether execution of process 800 is to continue. For example, if a vehicle including system 200 is powered off, module 105, and process 800, may cease operation, or module 105 may determine that process 800 is to be ended. In any case, if process 800 is not to continue after step 830, then process 800 ends. Otherwise, process 800 returns to step 825.

In step 835, which may follow step 825, module 105 determines whether the change in inputs 110 detected in step 825 is due to an error condition arising. For example, module 105 may include, or may have access to, tables such as those illustrated in FIGS. 5, 6 and 7. Such tables, as discussed above, may be used to determine the existence of error conditions.

Another way in which an error condition could arise is based on the make after break feature discussed above. That is, module 105 might determine that a first input 110 has broken from the A state to the B state, while a second input 110, which should have been made from a B state to the A state, according to table 400, has not done so. A failure of the make after break feature is a relatively serious failure, because module 105 cannot necessarily determine which of the two inputs 110 is providing bad data, or whether both are. Thus, with respect to fail-soft and fail-safe modes, discussed elsewhere, a failure of the make after break feature should generally be associated with a fail-safe mode.

In any case, if an error is detected in step 835, step 850 is executed next. However, if no error is detected, step 840 is executed next.

If step 840 has been reached, then inputs 110 have changed, and module 105 has determined that no error condition exists, meaning that a change in position for shift lever 305 has occurred. In step 840, if no error condition was detected in step 835, module 105 determines this change in position for shift lever 305 according to table 400. However, if an error condition was detected in step 835, and module 105 determined to apply a fail-soft mode in step 845, then module 105 may use one of tables 505, 510, 515, 605, 610, 615, 705, 710, and 715, or alternatively may use table 400, omitting the failed input 110, to determine a new position for shift lever 305, depending on the particular error condition determined to exist, e.g., a STB or STG in a particular input 110 or an improperly open input 110.

Next, in step 845, module 105 provides output instruction 115 to instruct TCM 205, ECM 225, instrument panel 220, etc. as appropriate, concerning the new position of shift lever 305. Accordingly, TCM 205, for example, may cause a vehicle to shift from a drive state to a neutral state, from a park states to a reverse state, etc., as appropriate.

Step 850 follow step 835 if module 105 has detected an error condition. In step 850, module 105 determines whether to apply a fail-safe or fail-soft mode based on the detected error condition in a manner as described above with respect to step 815. If a fail-safe mode is to be applied, step 820 is executed next. However, if a fail-soft mode is to be applied, step 840 is executed next.

As mentioned above, process 800 may end after either of steps 820 or 830.

CONCLUSION

Computer-executable instructions such as included in module 105 may be compiled or interpreted from computer programs created using a variety of programming languages and/or technologies known to those skilled in the art, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium includes any medium that participates in providing data (e.g., instructions), which may be read by a computer. Such a medium may take many forms, including, but not limited to, non-volatile media, volatile media, and transmission media. Non-volatile media include, for example, optical or magnetic disks and other persistent memory. Volatile media include dynamic random access memory (DRAM), which typically constitutes a main memory. Transmission media include coaxial cables, copper wire and fiber optics, including the wires and printed circuit board traces that comprise a system bus coupled to the processor. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain systems, and should in no way be construed so as to limit the claimed invention.

Accordingly, it is to be understood that the above description is intended to be illustrative and not restrictive. Many systems and applications other than the examples provided could be apparent upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future systems. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary in made herein. In particular, use of the singular articles such as "a," "the," "said," etc. should be read to recite one or more of the indicated elements unless a claim recites explicitly to the contrary.

What is claimed is:

1. A method, comprising:
   receiving one of a first signal, a second signal, and a third signal respectively from each of three inputs;
   comparing a pattern of states formed by the first signal, the second signal, and the third signal to a set of predetermined patterns;
   determining whether an error condition exists based on whether an error condition is indicated by one or more patterns identified from the set of predetermined patterns; and
   if an error condition exists, identifying a specific one of the inputs as a cause of the error based at least in part on the pattern or patterns identified from the set of predetermined patterns.

2. The method of claim 1, further comprising determining, based on the one or more identified patterns, an expected position of a physical member.

3. The method of claim 2, wherein the physical member is a shift lever in a vehicle.

4. The method of claim 2, further comprising:
   receiving one of a fourth signal, a fifth signal, and a sixth signal from each of the three inputs;
   comparing a second pattern of states formed by each of the fourth signal, the fifth signal, and the sixth signal to the set of predetermined patterns;

based on a second one or more of the identified patterns indicated by the comparing of the second pattern, determining a second expected position of the physical member.

5. The method of claim 4, wherein the pattern and the second pattern have a Hamming distance of at least two between them.

6. The method of claim 1, wherein the first signal, the second signal, and the third signal are each associated with one of a first asserted state, a second asserted state, and a default state.

7. The method of claim 6, further comprising determining that the input that is a cause of the error is providing a signal associated with one of the first asserted state, the second asserted state, and the default state.

8. The method of claim 6, wherein one of the first asserted state, the second asserted state and the default state represent an error condition.

9. The method of claim 1, wherein the set of predetermined patterns is stored in a table.

10. The method of claim 1, wherein the error is one of a make after break failure, a short to ground condition, a short to battery condition, and an open condition.

11. A method, comprising:
receiving one of a first signal, a second signal, and a third signal from each of three inputs;
comparing a first pattern of states formed by the first signal, the second signal, and the third signal to a set of predetermined patterns;
based on the comparing of the first pattern, determining an expected detent position of a physical member;
receiving one of a fourth signal, a fifth signal, and a sixth signal;
comparing a second pattern of states formed by the fourth signal, a fifth signal, and a sixth signal to the set of predetermined patterns;
based on the comparing of the second pattern, determining a second expected detent position of a physical member;
wherein the first pattern and the second pattern are separated by a Hamming distance of at least two.

12. The method of claim 11, further comprising determining whether an error condition exists based on whether an error condition is indicated by one or more patterns included in the set of predetermined patterns, and identified by at least one of the comparing of the first pattern and the comparing of the second pattern, and, if an error condition does exist, identifying a specific one of the inputs that is a cause of the error.

13. A non-transitory computer-readable medium tangibly embodying instructions executable by a processor, the instructions comprising instructions for:
receiving one of a first signal, a second signal, and a third signal respectively from each of three inputs;
comparing a pattern of states formed by the first signal, the second signal, and the third signal to a set of predetermined patterns;
determining whether an error condition exists based on whether an error condition is indicated by one or more patterns identified by the comparing from the set of predetermined patterns; and
if an error condition exists, identifying a specific one of the inputs as a cause of the error based at least in part on the pattern or patterns identified by the comparing.

14. The non-transitory computer-readable medium of claim 13, the instructions further comprising instructions for determining, based on the comparing, an expected position of a physical member.

15. The non-transitory computer-readable medium of claim 14, wherein the physical member is a shift lever in a vehicle.

16. The non-transitory computer-readable medium of claim 14, the instructions further comprising instructions for:
receiving one of a fourth signal, a fifth signal, and a sixth signal from each of the three inputs;
comparing a second pattern of states formed by each of the fourth signal, the fifth signal, and the sixth signal to the set of predetermined patterns;
based on a second one or more of the identified patterns indicated by the comparing of the second pattern, determining a second expected position of the physical member.

17. The non-transitory computer-readable medium of claim 16, wherein the pattern and the second pattern have a Hamming distance of at least two between them.

18. The non-transitory computer-readable medium of claim 14, wherein the first signal, the second signal, and the third signal are each associated with one of a first asserted state, a second asserted state, and a default state.

19. The non-transitory computer-readable medium of claim 18, the instructions further comprising instructions for determining that the input that is a cause of the error is providing a signal associated with one of the first asserted state, the second asserted state, and the default state.

20. The non-transitory computer-readable medium of claim 18, wherein one of the first asserted state, the second asserted state and the default state represent an error condition.

21. The non-transitory computer-readable medium of claim 13, wherein the set of predetermined patterns is stored in a table.

22. The non-transitory computer-readable medium of claim 13, wherein the error is one of a make after break failure, a short to ground condition, a short to battery condition, and an open condition.

23. A non-transitory computer-readable medium tangibly embodying instructions executable by a processor, the instructions comprising instructions for:
receiving one of a first signal, a second signal, and a third signal from each of three inputs;
comparing a first pattern of states formed by the first signal, the second signal, and the third signal to a set of predetermined patterns;
based on the comparing of the first pattern, determining an expected detent position of a physical member;
receiving one of a fourth signal, a fifth signal, and a sixth signal;
comparing a second pattern of states formed by the fourth signal, a fifth signal, and a sixth signal to the set of predetermined patterns;
based on the comparing of the second pattern, determining a second expected detent position of a physical member;
wherein the first pattern and the second pattern are separated by a Hamming distance of at least two.

24. The non-transitory computer-readable medium of claim 23, the instructions further comprising instructions for determining whether an error condition exists based on whether an error condition is indicated by one or more patterns included in the set of predetermined patterns, and identified by at least one of the comparing of the first pattern and the comparing of the second pattern, and, if an error condition does exist, identifying a specific one of the inputs that is a cause of the error.

* * * * *